United States Patent [19] [11] 3,825,855

Basset et al. [45] July 23, 1974

[54] FREQUENCY SYNTHESIZER WITH COARSE STAIRSTEP FREQUENCY CONTROL AND FINE PHASE CONTROL

[75] Inventors: Jean-Claude Basset, Paris; Pierre Heins, Argenteuil, both of France

[73] Assignee: U.S. Philips Corporation, New York, N.Y.

[22] Filed: Feb. 6, 1973

[21] Appl. No.: 330,005

[30] Foreign Application Priority Data

Feb. 8, 1972 France ............................ 72.04105

[52] U.S. Cl. ...................... 331/1 A, 331/4, 331/11, 331/14, 331/17, 331/25

[51] Int. Cl. ........................................ H03b 3/04

[58] Field of Search ............ 331/1 A, 4, 10, 11, 14, 331/17, 18, 25

[56] References Cited

UNITED STATES PATENTS 3,611,175 10/1971 Boelke .......................... 331/11 X

*Primary Examiner*—Herman Karl Saalbach
*Assistant Examiner*—Siegfried H. Grimm
*Attorney, Agent, or Firm*—Frank R. Trifari

[57] ABSTRACT

The output frequency of a voltage controlled oscillator is phase and frequency locked to the frequency of a reference source through a frequency converter. The frequency converter divides the voltage controlled oscillator frequency by an adjustable division ratio and applies the divided frequency to both a phase comparator and a frequency discriminator. A coarse frequency control unit applies an output of the frequency discriminator to the voltage controlled oscillator as a stepwise adjustable coarse frequency control signal. The phase comparator output provides a fine control signal to the voltage control oscillator. In response to an adjustment of the frequency converter to a new division ratio a two position switch sets the counting direction of an up-down counter in the coarse frequency control unit in accordance with the sense of the change in division ratio. In response to a change in the output frequency of the frequency converter the frequency discriminator provides an output pulse that initiates a timing sequence in a switching circuit. The switching circuit in response to the output pulse of the frequency discriminator first disconnects the phase comparator from the frequency converter for a predetermined time period, then disconnects the frequency discriminator from the coarse frequency control unit and reconnects the frequency converter to the phase comparator for a second predetermined time period, after which the phase and frequency adjusting circuits are restored.

9 Claims, 9 Drawing Figures

FREQUENCY SYNTHESIZER WITH COARSE STAIRSTEP FREQUENCY CONTROL AND FINE PHASE CONTROL

The invention relates to a frequency synthesizer comprising a voltage-controlled oscillator (VCO), a frequency converter connected to the output of said oscillator and being adjustable in accordance with the desired frequency, a reference frequency source, a coarse frequency control unit connected to a control input of the oscillator and adapted to vary the oscillator tuning frequency throughout its tuning range, a frequency discriminator for producing an output signal dependent on the frequency difference between the output frequency of the frequency converter and a reference frequency supplied by the reference source, means for applying said output signal as a switch-on signal to said coarse frequency control unit and a fine frequency control unit in the form of a phase comparator for producing a control voltage dependent on the phase difference between the output frequency of the frequency converter and the reference frequency supplied by the reference source, means for applying said control voltage to a control input of the oscillator to lock this oscillator at the desired frequency.

Synthesizers of the kind described above are known and are frequently used. If used, for example, in simplex communication systems which require a very quick change of the oscillator tuning these known synthesizers are found to be not very suitable. For realizing a quick change of tuning it is necessary that the coarse control of the oscillator can vary the tuning very rapidly in order to bring the oscillator output frequency quickly within the pull-in range of the phase comparator intended for fine tuning. For a satisfactory operation of the phase comparator it is, however, necessary that the oscillator frequency passes through the pull-in range at a comparatively slow rate because otherwise it is impossible to build up a sufficient control voltage so as to effect the desired locking.

Moreover, the above-mentioned contradictory requirements are accompanied by the difficulty that the comparatively large voltage variations required for quickly realizing a large tuning variation, cause parasitic and transient phenomena which delay the activation of the fine tuning control because they disappear relatively slowly.

An object of the invention is to provide a synthesizer of the kind described in the preamble in which the above-mentioned difficulties are obviated to a large extent and which makes quick tuning variations possible while at the same time accurate locking at the desired frequency is ensured.

To this end the synthesizer according to the invention is characterized in that the coarse frequency control unit is adapted for supplying a control voltage which increases or decreases stepwise with time dependent on the position of a two-position switch which in the case of variation of the adjustment of the frequency converter is set to the one or the other position in accordance with the sense of direction of the frequency variation brought about by the adjustment, the synthesizer furthermore comprising a switching circuit including a timing circuit, said switching circuit in the rest condition connecting the output of the frequency converter to an input of the phase comparator and also the output of the frequency discriminator to an input of said coarse frequency control unit, output pulses from the frequency discriminator bringing said switching circuit from its rest condition to the operative condition in which condition the switching circuit successively passes through a first switching condition and a second switching condition under the control of said timing circuit, the switching circuit in its first switching condition interrupting the said connection between the frequency converter and the phase comparator and in its second switching condition restoring the latter connection and interrupting the said connection between the frequency discriminator and the coarse frequency control unit and subsequently returning automatically to the rest condition.

When using the steps according to the invention a very quick tuning control is obtained on the one hand because the coarse control in the switched-on condition supplies a stair case voltage which varies the oscillator tuning directly in the direction of the desired frequency and on the other hand because the switching circuit prevents the occurrence of parasitic transient phenomena.

The invention and its advantages will be described in greater detail with reference to the drawing in which FIG. 1 shows the principle circuit diagram of a known synthesizer of the kind described in the preamble;

Figure 1:
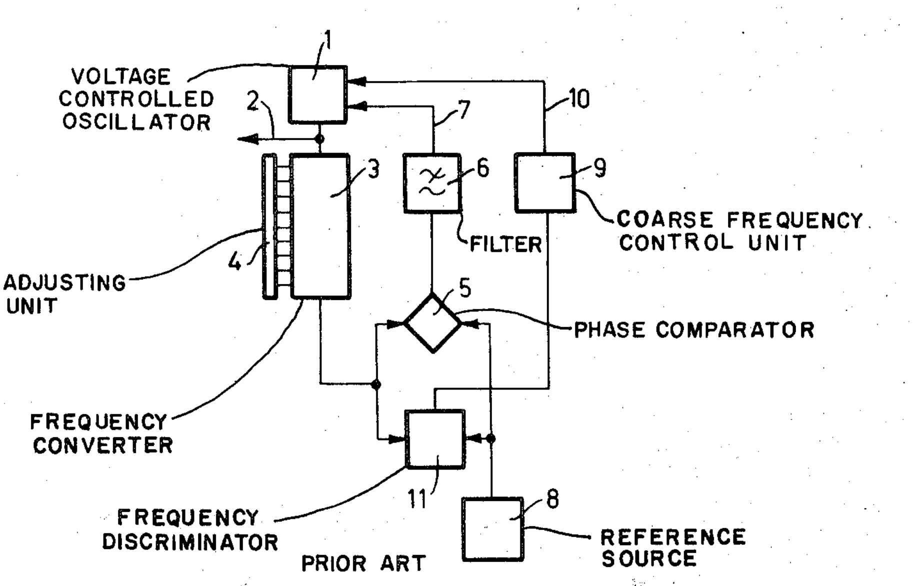

In FIG. 1, the reference numeral 1 denotes a voltage-controlled oscillator whose output signal is applied to an output 2 and to a frequency converter 3 which in this known arrangement is constituted by a frequency divider whose division ratio is adjustable with the aid of an adjusting unit 4. The frequency of the output signal from the frequency divider is determined by the adjusted division ratio of the divider and the frequency of the oscillator output signal. Furthermore the synthesizer shown in FIG. 1 includes a coarse frequency control unit 9 which provides an output voltage varying with time which is applied through the lead 10 to a control input of the voltage-controlled oscillator 1 and which can vary the oscillator tuning throughout its tuning range. This coarse control unit 9, however, only supplies a varying output voltage when a frequency discriminator 11 detects a frequency difference between the output frequency of the frequency converter and a reference frequency provided by a reference source 8.

Furthermore the synthesizer is provided with a fine control in the form of a phase comparator 5 generating a control voltage dependent on the phase difference between the output frequency of the frequency converter and the reference frequency supplied by reference source 8. This control voltage is applied through the lead 7 to a control input of the oscillator to lock the oscillator output frequency at the desired frequency.

Figure 2:
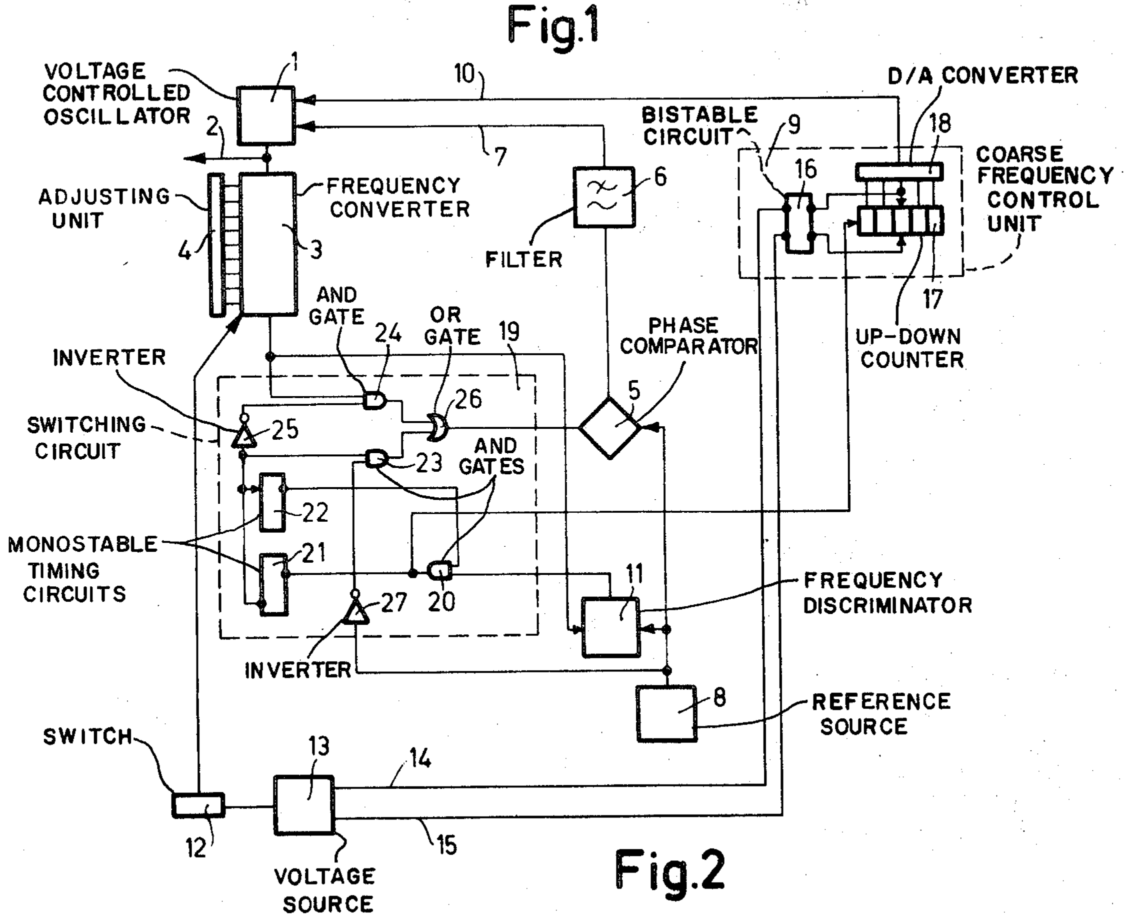
FIG. 2 shows the block diagram of the synthesizer according to the invention.

FIG. 2 shows a possible embodiment of the synthesizer according to the invention in which the parts corresponding to those in FIG. 1 have the same reference numerals. According to the invention the synthesizer according to FIG. 2 is distinguished in that the coarse frequency control unit 9 is adapted for supplying a control voltage which increases or decreases stepwise with time dependent on the position of a two-position switch 12 which upon variation of the adjustment of the frequency converter 3 is set to one or the other position in accordance with the sense of direction of the frequency variation brought about by the adjustment. The synthesizer furthermore comprises a switching circuit 19 including a timing circuit 21, 22. This switching circuit in the rest condition connects the output of the frequency converter 3 to an input of the phase comparator 5 and connects the output of the frequency discriminator 11 to an input of said coarse frequency control unit 9. Output pulses from the frequency discriminator 11 bring this switching circuit 19 from its rest condition to its operative condition in which condition the switching circuit 19 under the control of said time circuit 21, 22 successively passes through a first switching condition and a second switching condition. In its first switching condition it interrupts the said connection between the frequency converter 3 and the phase comparator 5 and in its second switching condition it restores the latter connection and interrupts the connection between the frequency discriminator 11 and an input of the coarse frequency control unit 9, and subsequently it return automatically to its rest condition.

In the embodiment shown the two -position switch 12 is coupled, for example, to a transmit-receive switch of the transceiver for Simplex traffic. The operation of the two-position switch 12 simultaneously sets the adjusting unit 4 of the frequency divider 3 to the desired frequency and also causes the voltage source 13 to supply a voltage which, dependent on the position of switch 12, is applied either through lead 14 or through lead 15 to the bistable circuit 16 forming part of the coarse frequency control unit 9. In the embodiment shown the coarse control unit 9 includes an up-down counter 17 to which the output pulses from the discriminator 11 are applied and which counts up or down dependent on the position of the bisable circuit 16. A digital-to-analog converter 18 is connected to the counter 17. This converter produces a control voltage, which decreases or increases stepwise dependent on the counter contents and this control voltage is applied through lead 10 to a control input of oscillator 1.

In the embodiment shown the switching circuit 19 includes the said timing circuit which is constituted by two monostable circuits 21 and 22. The switching circuit further comprises an AND gate 20 enabled in the rest condition of the switching circuit and two inverters 25 and 27 as well as two AND gates 23 and 24 whose outputs are connected to a common OR gate 26.

The operation of the switching circuit 19 is as follows: when the oscillator output frequency is locked at the desired frequency by the phase control loop, the frequency discriminator 11 does not supply output pulses, which means that the AND gate 20 connected to the output of the frequency discriminator receives a signal of the value logic 0 at one of its inputs and thus no pulse occurs at the input of the monostable circuit 21 which therefore remains in its stable state. A 0 signal then occurs at one of its inputs which, when applied to the input of the other monostable circuit 22, causes this circuit to be likewise in its stable state in which it applies a signal of the value logic 1 to the second input of the AND gate 20. The signal of value 0 occurring at the output of the monostable circuit 21 is applied to the AND gate 23 in order to keep this gate closed and to the other AND gate 24 through an inverter 25 so that the pulses occurring at the output of frequency divider 3 are applied to the phase comparator 5 through AND gate 24 and OR gate 26.

As soon as the oscillator tuning frequency no longer corresponds to the desired frequency, the frequency discriminator 11 supplies output pulses which are applied through the AND gate 20 to the up-down counter 17 and to the input of the monostable circuit 21 which is brought to its non-stable state at, for example, the occurrence of the negative edge of such a pulse. The output signal from monostable circuit 21 then becomes a logic signal of value 1. This transition does not have any influence on the monostable circuit 22. This signal is further directly applied to the AND gate 23 so that the pulses occurring at the output of the reference source are applied through inverter 27 and gates 23 and 26 to phase comparator 5 in order to render this comparator inactive, and is applied through the inverter 25 to the gate 24 in order to interrupt the connection between the output of the frequency divider 3 and the input of the phase comparator 5.

Thus, during the operative condition of the switching circuit only the output voltage from the coarse frequency control unit is applied to a control input of the voltage-controlled oscillator and this coarse control is in no way affected by the phase control loop. The duration of the first switching condition occurring during this operative condition of the switching circuit is determined by the monostable circuit 21.

After a certain period the monostable circuit 21 automatically returns to its stable state and a logical 0 signal occurs at its output which causes the monostable circuit 22 to be brought to its non-stable state so that a logical 0 signal occurs at the AND gate 20 and consequently the connection between the discriminator 11 and the input of the coarse frequency control unit 9 is interrupted.

The logical 0 signal which occurs at the output of the monostable circuit 21 also restores the connection between the output of the frequency divider 3 and the input of the phase comparator 5 so that the fine tuning becomes operative; transient phenomena may then occur in the form of parasitic voltages to which the frequency discriminator may react by starting to produce output pulses. These are not, however, applied to the input of the coarse control unit 9 because the connection with the input of the coarse control unit is interrupted. Thus it is prevented that the operation of the frequency discriminator 11 affects the fine frequency control by delaying its locking operation.

When the monostable circuit 22 automatically returns to its stable state, the circuit is subsequently brought back automatically to its rest condition. The time constants of the two monostable circuits 21 and 22 are chosen to be such that the time interval during which they are in their non-stable state is as short as possible. For the monostable circuit 22 this internal is given by the time required by the phase comparator to build up to a DC control voltage and this time is only short because the signals applied to the inputs of the phase comparator have been rendered substantially equal in frequency by the action of the coarse frequency control unit 9. The time constant of the monostable circuit 21 is given by the maximum time required by this coarse tuner frequency control unit 9 and this duration is, for example, in the order of 10 milliseconds. More particularly the time constants of the monostable circuit 21 are chosen to be such that the time interval during which this circuit is in its non-stable state is slightly longer than the maximum time spacing between two successive output pulses from the frequency discriminator 11 so that the monostable circuit 21 remains in its non-stable state as long as the frequency discriminator produces output pulse. Thus it is achieved that the fine frequency control sooner becomes active when the desired frequency is in the vicinity of the actual frequency then in case of a great difference between the desired frequency and the actual frequency.

Figure 3:
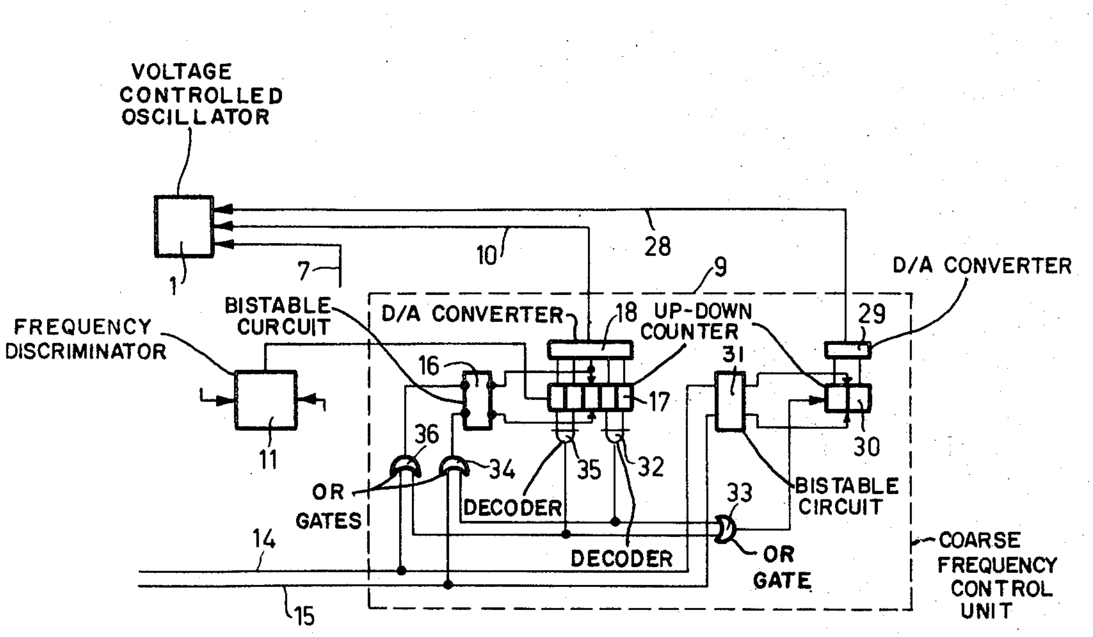
FIG. 3 shows a possible embodiment of the coarse frequency control unit used in a synthesizer comprising a voltage-controlled oscillator of the type which can be switched to the different tuning sub-ranges with the aid of a selector switch.

The switching circuit 19 described hereinbefore thus prevents the control voltages applied through the leads 7 and 10 to the control inputs of the voltage-controlled oscillator from counteracting each other when the frequency is changed. FIG. 3 shows a modification of the invention in which the voltage-controlled oscillator 1 is switchable, that is to say, the tuning range of the oscillator is switchable so that frequencies located in successive sub-ranges can be supplied. To this end the V.C.O. may be provided with a separate tunable circuit for each partial sub-range or, alternately, may comprise different oscillators.

Figure 4:
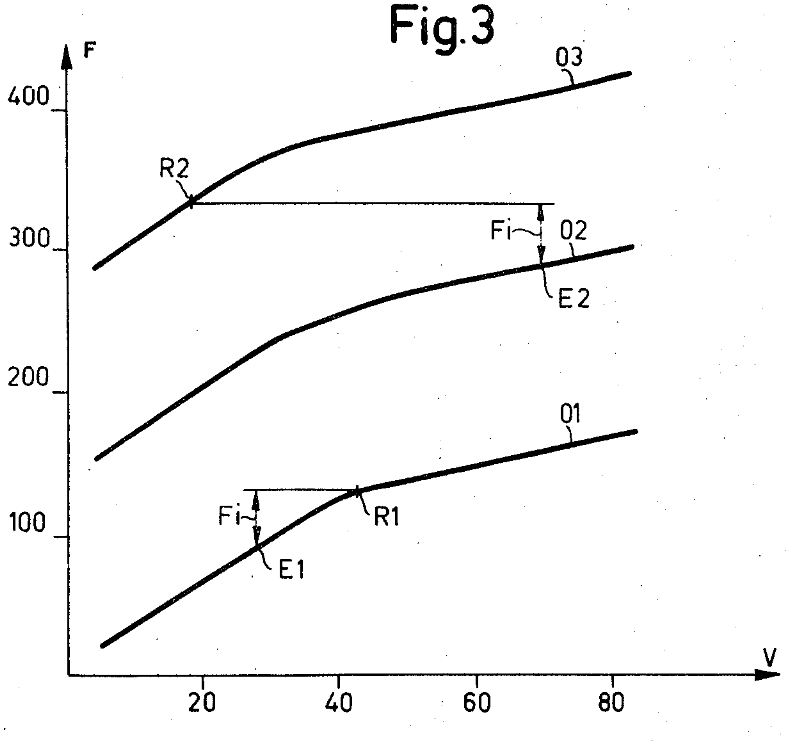
FIG. 4 shows the voltage-frequency diagrams of a voltage-controlled oscillator which can be switched to three different sub-ranges.

The components corresponding to those in FIG. 2 have the same reference numerals in FIG. 3. The circuit shown in FIG. 3 is distinguished from that in FIG. 2 in that the coarse frequency control unit 9 is formed differently in connection with the different sub-ranges of the voltage-controlled oscillator. The oscillator can be switched to the different sub-ranges by means of a switching signal which is applied through the lead 28 to the oscillator. This switching signal is derived from a digital-to-analog converter 29 which is connected to the outputs of an up-down counter 30; the successive stages of the counter 30 cause the switching to successive sub-ranges of the voltage-controlled oscillator 1. For the purpose of explanation FIG. 4 shows the voltage-versus-frequency characteristics of an oscillator which has three sub-ranges. The frequencies are plotted in, for example, MHz on the vertical axis, while the horizontal axis shows the voltage. The first position of the counter 30 switches on the first sub-range whose voltage-frequency characteristic is denoted by curve 01; for the second sub-range the associated voltagefrequency curve is denoted by 02 and for the third sub-range it is denoted by 03. The counter 30 counts either up or down dependent on the pulses which appear on leads 14 and 15 and which are applied to the bistable circuit 31 as well as is the case for the up-down counter 17. The coarse control unit 9 shown in FIG. 3 further comprises two decoders 32, 35 which are connected to the outputs of the up-down counter 17. Decoder 32 provides an output in response to the maximum counting position of counter 17 and decoder 35 provides an output in response to the minimum counting position of counter 17, the coarse control unit 9 also comprises three OR gates 33, 34 and 36 which are included in the circuit in the manner shown in the Figure.

The operation of the coarse control unit shown in FIG. 3 is as follows: when a pulse appears on lead 14 the counters 17 and 30 are brought to their up-counting position and the counter 17 counts the output pulses from the frequency discriminator while the counter 30 is ready to count the pulses which appear at its input. It is then assumed that the counter 30 is in its minimum counting position, that is to say, the sub-range is switched on which corresponds to the voltage-versus-frequency curve denoted by 01 in FIG. 4.

When the counter 17 reaches its maximum counting position, this is decoded by the decoder 32 which then provides an output pulse which is applied to the counter 30 through the OR gate 33. The content of the counter 30 then increases by one unit, that is to say, there occurs a switch-over to the next sub-range corresponding to the voltage-versus-frequency curve 02 shown in FIG. 4. The output pulse from the decoder 32 is also applied through the OR gate 34 to the bistable circuit 16 with the result that the counter 17 is brought to its down-counting position. When the counter 17 reaches its minimum counting position as a result of the output pulses from the frequency discriminator applied thereto, this position is decoded by the decoder 35 which then supplies an output pulse which again increases the contents of the counter 30 by one unit so that there is a switch-over to the next sub-range corresponding to the voltage-frequency characteristic 03 shown in FIG. 4. The output pulse from decoder 35 is also applied through OR gate 36 to counter 17 which thereby is brought to its up-counting position again.

The process described is repeated until the frequency discriminator 11 no longer supplies any output pulses. It is to be noted that in this process the contents of the counter 17 increase every time by one unit only, which means that the voltage variation of the stepwise increasing or decreasing voltage on the lead 10 is relatively small per step so that large voltage variations causing only slowly disappearing transient phenomena are completely prevented.

Let us consider the operation of the coarse control for the case where the voltage-controlled oscillator must be able to supply two frequencies dependent on the position of a transceiver switch of a Simplex transceiver. Assuming these two frequencies being located in the same sub-range corresponding to the voltage-frequency curve 01, the following explanation is also applicable to the embodiment shown in FIG. 2. If these two frequencies are given by for instance, the coordinates of the points E1 and R1 of FIG. 4, these frequencies are spaced apart over a frequency interval $F_t$.

When the switch 12 is put to the position which corresponds to the higher frequency $R_1$ to be supplied by the synthesizer, the source 13 applies a pulse through lead 14 to the counter 17 which is thereby set to its up-counting position. In addition the adjusting unit 4 is set at the desired frequency. The frequency discriminator 11 then detects a frequency difference and thus transmits pulses which are counted by the counter 17. The counter contents is converted by the digital-to-analog converter 18 to produce a control voltage which is applied through the lead 10 to the oscillator 1 for coarse adjustment at the desired frequency $R_1$.

Figure 5:
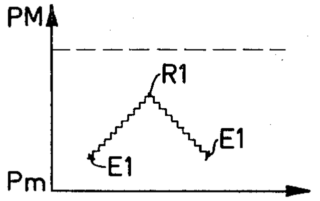
FIG. 5 shows the stair case voltage which is derived from an up-down counter forming part of the coarse frequency control unit.

FIG. 5 shows the variation of the contents of the counter 17 as a function of the number of pulses applied thereto; the ordinates PM and P*m* show the maximum and the minimum counting positions, respectively, of the counter 17; as FIG. 5 shows, the counter contents increase in order to shift voltage controlled oscillator 1 from the frequency $E_1$ to the frequency $R_1$.

To return from the frequency $R_1$ to the frequency $E_1$ the switch 12 is put to its other position and a pulse appears on lead 15 which brings the counter 17 to its downcounting position so that the counter contents decrease.

Figure 6:
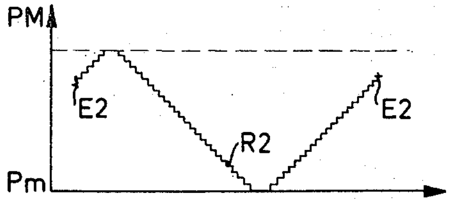
FIG. 6 shows the stair case voltage from the same up-down counter as in FIG. 5 with the counters in a down counting mode.

Considering the embodiment of FIG. 3 and assuming that the two frequencies are represented by the ordinates of the points $E_2$ and $R_2$ which are located on the voltage-frequency characteristic curves 02 and 03 shown in FIG. 4, the mutual frequency spacing in this case is also equal to $F_i$. When the switch 12 is operated in order to shift the frequency from the frequency corresponding to point $E_2$ to the frequency corresponding to point $R_2$, this results in the two counters 17 and 30 being brought to the up-counting position. The frequency discriminator 11 then again reacts to the frequency difference by applying output pulses to the counter 17 whose contents consequently increase to its maximum counting position (see FIG. 6) which decoded in the decoder 32, causes an output pulse to occur which pulse increases the contents of the counter 30 by one unit. As a result a switch-over is effected to the next sub-range and the counter 17 is brought to its down-counting position so that the counter contents decrease until the frequency supplied by oscillator 1 is substantially equal to the desired frequency $R_2$. To return to the frequency corresponding to the point $E_2$ the switch 12 is set to its original position so that the two counters 17 and 30 are brought to the down-counting position with the result that the counting contents of the counter 17 decrease to its minimum counting position (see FIG. 6) which is decoded by the decoder 35 for generating a signal bringing about the switch-over to the original sub-range and which also brings the counter 17 in the up-counting position so that the contents of this counter increase until the oscillator output frequency substantially corresponds to the desired frequency $E_2$.

It is to be noted that in the method according to the invention the shortest path is taken for going from the one to the other frequency without large sudden voltage variations occurring on lead 10.

Figure 7:
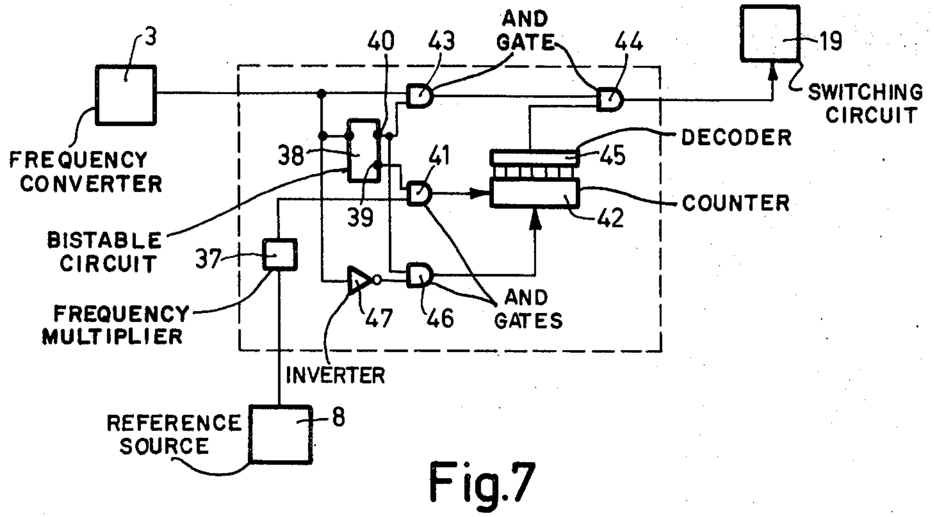
FIG. 7 shows a possible embodiment of the frequency discriminator used in the synthesizer according to the invention.
Figure 8:
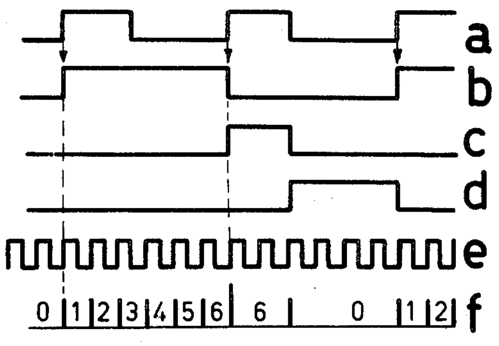
FIG. 8 shows a number of diagrams to explain the operation of the discriminator of FIG. 7

A possible embodiment of the frequency discriminator 11 which may be advantageously used in the synthesizer according to the invention is shown in FIG. 7. FIG. 8 shows a number of signals which occur at different points of the circuit shown in FIG. 7. FIG. 8*a* shows the output signal from the frequency divider 3 and FIG. 8*e* shows the reference signal which is derived in FIG. 7 from a frequency multiplier 37 connected to the reference source 8, it being desirable for a satisfactory operation of the discriminator that the cyclic ratio of these signals is equal to ½. The output signal from the frequency divider 3 in FIG. 8*a* is applied to a bistable circuit 38 which provides the signal shown in FIG. 8*b* at its output 39; the same, but inverted signal occurs at the output 40. The bistable circuit 38 passes from the one stable state to the other stable state when the trailing edges of, for example, the signal applied to the input occur. It is to be noted that, due to the bistable circuit., the signal obtained is independent of the duty cycle of the output signal from the frequency divider 3.

Furthermore the frequency discriminator comprises an AND gate 41 whose two inputs are connected to the output terminal 39 of the bistable circuit 38 and to the output of the frequency multiplier 37, respectively. The output of said AND gate 41 is connected to the input of a counter 42. When a logical 1 signal occurs at the output 39 of the bistable circuit 38, the reference pulses occurring at the output of the multiplier 37 are counted in the counter 42 as long as this output signal maintains its logical 1 value. FIG. 8*f* shows the contents of the counter 42 while for the sake of clarity 6 pulse positions are shown only.

Furthermore the discriminator includes two AND gates 43 and 46. The AND gate 43 whose inputs are connected to the output 40 of the bistable circuit 38 and the output of the frequency divider 3 supplies an output signal which is shown in FIG. 8*c* and which is applied to an AND gate 44 for generating a window for observing the contents of the counter 42. The second input of AND gate 44 is to this end connected to a decoder 45 which only supplies an output pulse when the contents of the counter are not located between two given values.

Figure 9:
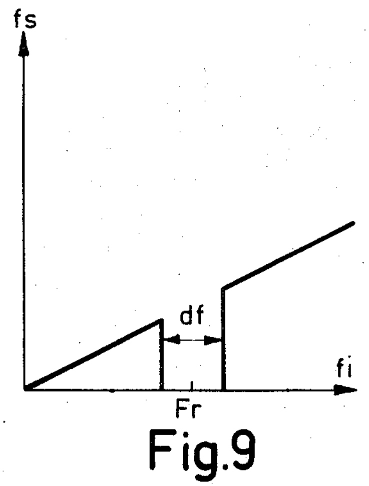
FIG. 9 shows the discriminator response curve.

AND gate 46 has two inputs one of which is connected to the output terminal 40 of the bistable circuit 38 and the other of which is connected to the output of the frequency divider 3 through an inverter 47. The output signal from this AND gate is shown in FIG. 8*d* and is applied as a reset signal to the counter 42. FIG. 9 shows the response curve of this discriminator. The horizontal axis shows the frequency $f_i$ of the signals which occur at the output of the frequency divider 3 and the vertical axis shows the frequency $f_s$ of the output pulses supplied by the discriminator.

Beyond the frequencies for which the decoder 45 connected to the counter 42 does not supply output pulses the frequency of the pulses is equal to half the frequency of the output signal from the frequency divider 3. The contents of the counter 42 are observed during one of two successive periods of the output signal from the frequency divider 3.

The frequency domain *df* in FIG. 9 in which the frequency discriminator does not supply output pulses is determined on the one hand by the number of successive positions of the counter 42 which are not decoded and on the other hand by the frequency of the reference pulses which are counted in the counter.

It will be evident that these reference pulses may be supplied by any suitable pulse oscillator. This frequency domain *df* may thus be adjusted in a simple manner so that the discriminator can be adapted in a simple manner to the synthesizer according to the invention, the frequency domain *df* being controlled as a function of the passband of the fine control loop so that the frequency F*r* of the signal provided by the reference source is located approximately in the middle of the frequency domain *df*.

What is claimed is:

1. A frequency synthesizer comprising a voltage-controlled oscillator (VCO), a frequency converter connected to the output of said oscillator and being adjustable in accordance with the desired frequency, a reference frequency source, a coarse frequency control unit connected to a control input of the oscillator and adapted to vary the oscillator tuning frequency throughout its tuning range, a frequency discriminator for producing an output signal dependent on the frequency difference between the output frequency of the frequency converter and a reference frequency supplied by the reference source, means for applying said output signal as a switch-on signal to said coarse frequency control unit, and a fine frequency control unit in the form of a phase comparator for producing a control voltage dependent on the phase difference between the output frequency of the frequency converter and the reference frequency supplied by the reference source, and means for applying said control voltage to the input of the oscillator to lock said oscillator at the desired frequency, characterized in that said coarse frequency control unit is adapted for supplying a control voltage which increases or decreases stepwise with time dependent on the position of a twoposition switch which in case of variation of the adjustment of the frequency converter is set to the one or the other position in accordance with the sense of direction of the frequency variation brought about by the adjustment, the synthesizer furthermore comprising a switching circuit including a timing circuit, said switching circuit in the rest condition connecting the output of the frequency converter to an input of the phase comparator and also the output of the frequency discriminator to an input of said coarse frequency control unit, output pulses from the frequency discriminator bringing said switching circuit from its rest condition to the operating condition in which condition the switching circuit successively occupies a first and a second switching position under the control of said timing circuit, said switching circuit in a first switching position interrupting the said connection between the frequency converter and the phase comparator and in its second switching condition restoring the latter connection and interrupting the said connection between the frequency discriminator and said coarse frequency control unit, and subsequently returning automatically to the rest position.

2. A sythesizer as claimed in claim 1, wherein the coarse frequency control unit is an up-down counter which as a function of the position of said twoposition switch is set to its up-counting or down-counting position, the contents of the counter being converted with the aid of an digital-to-analog converter into an analog control signal which is applied for coarse adjustment to a control input of the oscillator.

3. A synthesizer as claimed in claim 1 in which the tuning range of the voltage-controlled oscillator is subdivided in successive sub-ranges and in which each of these sub-ranges can be selected with the aid of a selector switch, characterized in that said selector switch is operated by an output signal from said course frequency control unit.

4. A synthesizer as claimed in claim 3, wherein said coarse frequency control unit comprises an up-down counter which is connected to the output of the frequency discriminator, to which counter a digital-to-analog converter is connected for producing a control voltage corresponding to the counter contents for the purpose of coarse tuning of the oscillator and to which counter a first and a second decoder are connected, said first decoder supplying an output pulse setting the first counter in the down-counting position when it reaches the maximum counter contents and said second decoder supplying an output pulse setting the said first counter in the up-counting position when it reaches the minimum counter contents, and a second up-down counter connected to a common output of said first and second decoders, to which counter a digital-to-analog converter is connected for supplying a selection signal which, applied to the said oscillator selector switch, switches-over to the sub-range of the oscillator determined by the counter contents of said second counter.

5. A synthesizer as claimed in claim 4, wherein said second counter is set to the up-counting or down-counting position as a function of the position of said two-position switch.

6. A synthesizer as claimed in claim 1, wherein the timing circuit forming part of said switching circuit comprises a first and a second monostable circuit, the duration of the first and second switching positions successively occurring during the operative condition of the switching circuit being determined by the time constants of said first and second monostable circuits.

7. A synthesizer as claimed in claim 6, wherein the frequency discriminators are built up from a counter having a decoder connected thereto which supplies an output signal when the counter contents are smaller than a given first value or larger than a given second different value, a discriminator input gate, a counter input gate, a counter reset gate as well as a bistable circuit and a discriminator output gate connected to the output of the discriminator input gate and the output of the decoder, the signal derived from the frequency converter being applied to an input of the discriminator input gate and to an input of the bistable circuit and through an inverter to an input of the counter reset gate, the second input of the discriminator input gate and the second input of the counter reset gate being connected to an output of the bistable circuit whose second output is connected to an input of the counter input gate, the output pulses from a reference source being applied to said second input.

8. A synthesizer as claimed in claim 1 wherein the frequency converter is constituted by a digital frequency divider.

9. A synthesizer as claimed in claim 1 adapted for use in a Simplex transceiver, wherein said two-position switch is coupled to the transmitreceive switch of the transceiver so that the two switches are operated simultaneously.

* * * * *